Figure 1A:
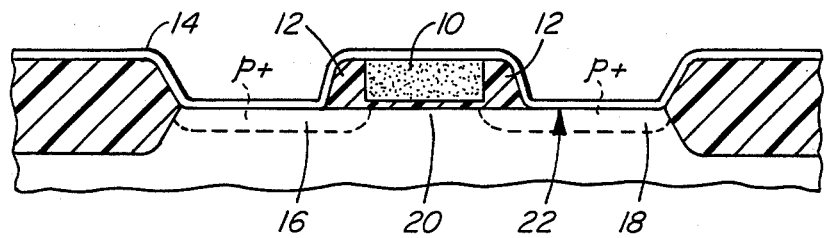

United States Patent [19]

Naguib et al.

[11] Patent Number: 4,683,645
[45] Date of Patent: Aug. 4, 1987

[54] PROCESS OF FABRICATING MOS DEVICES HAVING SHALLOW SOURCE AND DRAIN JUNCTIONS

[75] Inventors: Hussein M. Naguib, Fremont, Calif.; Iain D. Calder, Nepean, Canada; Vu Q. Ho, Kanata, Canada; Abdalla A. Naem, Ottawa, Canada

[73] Assignee: Northern Telecom Limited, Montreal, Canada

[21] Appl. No.: 813,232

[22] Filed: Dec. 24, 1985

[30] Foreign Application Priority Data

Jun. 28, 1985 [CA] Canada .................................. 485874

[51] Int. Cl.⁴ ..................... H01L 21/265; H01L 29/78
[52] U.S. Cl. ........................... 437/41; 148/DIG. 140; 357/65; 437/46; 437/24
[58] Field of Search ...................... 29/571, 576 B, 591; 148/1.5, 187; 357/65

[56] References Cited

U.S. PATENT DOCUMENTS

| | | | |
|---|---|---|---|
| 4,297,782 | 11/1981 | Ito | 29/571 |
| 4,551,908 | 11/1985 | Nagasawa et al. | 29/571 |
| 4,558,507 | 12/1985 | Okabayashi et al. | 29/571 |
| 4,577,396 | 3/1986 | Yamamoto et al. | 29/576 B |

OTHER PUBLICATIONS d'Heurle et al., Jour. Appl. Phys. 53 (1982), 8765.
Sorimachi et al., Jap. Jour. Appl. Phys. 21 (1982), 752.
Hewett et al., Jour. Appl. Phys. 57 (1985), 1089.
Poker et al., Jour. Appl. Phys. 57 (1985), 1414.
Agamy et al., Jour. Vac. Sci. Technol. A3 (1985), 718.
D. L. Kwong et al., "Simultaneous Formation of Silicide Ohmic Contacts and Shallow p+—n Junctions by Ion-Beam Mixing and Rapid Thermal Annealing", IEEE Electron Device Letters, vol. EDL-6, No. 5, pp. 244-246, May 1985.
Hidekazu Okabayashi et al., "Low-Resistance MOS Technology Using Self-Aligned Refractory Silicidation", IEEE Transactions on Electron Devices, vol. ED-31, No. 9, pp. 1329-1334, Sep. 1984.
M. Y. Tsai et al., "Refractory Metal Silicide Formation Induced by As Implantation", Appl. Phys. Lett. 37, pp. 295-298, Aug. 1, 1980.
S. D. Lester et al., "Ion-Beam Modification of Silicided Ti/Si Contacts", Mat. Res. Soc. Symp. Proc. vol. 45-1985 Materials Research Society, pp. 159-164.
Manuela Finetti et al., "A Self-Annealing Technique for Simultaneous Titanium Silicide and N/P Junction Formation", Mat. Res. Soc. Symp. Proc. vol. 45-1985 Materials Research Society, pp. 177-182.
T. Paul Chow et al., "Refractory Metal Silicides: Thin-Film Properties and Processing Technology", IEEE Transactions on Electron Devices, vol. ED-30, No. 11, Nov. 1984, pp. 1480-1497.

Primary Examiner—Upendra Roy
Attorney, Agent, or Firm—Schwartz, Jeffery, Schwaab, Mack, Blumenthal & Evans

[57] ABSTRACT

In a metal oxide semiconductor field effect transistor fabrication process, refractory metal is deposited over designated source and drain areas within a silicon substrate. Refractory metal and silicon at the interface is then mixed by ion implantation of a heavy neutral ion species such as germanium. To minimize source/drain junction depth, the source and drain locations can be subjected to bombardment by a lighter ion such as silicon which amorphizes silicon to a predetermined depth under the designated source and drain regions and so substantially confines dopant diffusion to the silicon amorphized region. To render the source and drain of desired conductivity type, an ion implantation of a non-neutral ion is then performed.

3 Claims, 9 Drawing Figures

PROCESS OF FABRICATING MOS DEVICES HAVING SHALLOW SOURCE AND DRAIN JUNCTIONS

This invention relates to a process for the fabrication of MOS semiconductor devices using silicide contacts.

Modern very large scale integrated (VLSI) circuits are composed of semiconductor devices of extremely small dimensions. In particular, the source and drain junctions must be shallow, while still retaining the low resistivity, contact resistance, and leakage current of large scale devices. These requirements can be met by the use of a barrier metal over the sources and drains which, as a metal, lowers resistivity, and by acting as a barrier to silicon/metal (usually aluminum) interdiffusion, maintains a low leakage current even for a shallow junction. One type of material commonly used to form ohmic contacts is a silicon/refractory metal compound, or silicide. These refractory metal silicides may be either deposited (usually by sputtering) as a compound, or the metal may be deposited onto the silicon, followed by a chemical reaction to form the silicide. The reaction may be performed by heating the specimen to a high temperature, or ion beam bombardment may be used to mix the constituents and assist or even carry out the reaction to completion (D. L. Kwong, D. C. Meyers, and N. S. Alvi, IEEE Electron Dev. Lett. EDL-6, 244–246, 1985; H. Okabayashi, M. Morimoto, and E. Nagasawa, IEEE Trans. Electron Dev. Ed-31, 1329–1334, 1984; and M. Y. Tsai, C. S. Petersson, F. M. D'Heurle, and V. Maniscalco, Appl. Phys. Lett 37, 295–298, 1980). Lateral growth of silicide during the reaction can be a problem, but is controlled by the use of rapid thermal annealing or ion beam mixing or both (S. D. Lester and N. W. Cheung, to be published in "Ion Beam Processes in Advanced Electronic Materials and Device Technology", ed. by F. H. Eisen, T. W. Sigmon, and B. R. Appleton Materials Research Society, Pittsburgh 1985). If the specimen temperature is maintained at a high level, greater than 300° C. during ion implanation then the reaction will occur in situ. At lower temperatures ion beam mixing will assist the later thermal reaction by causing intermixing of the metal and silicon at their mutual interface, thereby destroying any intervening film (such as a thin natural $SiO_2$) that would retard the reaction.

It is known in the fabrication of silicon MOS devices to simultaneously form an $n^+p$ junction and a $TiSi_2$ contact layer by ion implantation of $As^+$ ions which cause mixing of Ti and Si and act as an n-type dopant in the underlying silicon (H. Okabayashi, M. Morimoto, and E. Nagasawa, IEEE Trans. Electron Dev. ED-31, 1329–1334, 1984; M. Y. Tsai, C. S. Petersson, F. M. D'Heurle, and V. Maniscalco, Appl. Phys. Lett. 37, 295–298, 1980).

There are three disadvantages to this technique. Firstly, it is not applicable to a $p^+n$ junction since arsenic is used; secondly, rapid damage-assisted diffusion of arsenic has been observed, preventing the formation of an acceptably shallow junction (M. Finetti, E. Gabilli, G. Lulli, R. Lotte, P. G. Merli, and R. Nipoti, to be published in "Ion Beam Processes in Advanced Electronic Materials and Device Technology", ed. by F. H. Eisen, T. W. Sigmon, and B. R. Appleton, Materials Research Society, Pittsburgh 1985). Thirdly, because an oxide side wall spacer is required to separate the metal over the gate from that over the drain, there are two different ion implantation steps required: doping (before spacer formation), and mixing (after metal deposition).

The present invention uses germanium as a mixing ion followed by silicon ion implant and then followed by a dopant ion implant. A Germanium is suitably heavy to efficiently perform mixing and it is electrically inert in silicon so it can be used for either $p^+n$ or $n^+p$ junctions.

Silicon implant will amorphize the silicon substrate, thereby confining dopant diffusion to the amorphized region, and allowing a shallow junction to be formed. The silicon ions may also assist with the ion beam mixing.

Figure 1B:
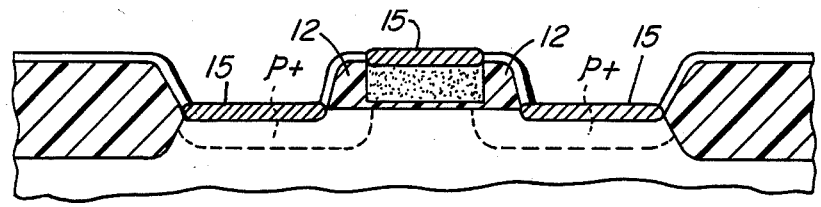
Figure 1C:
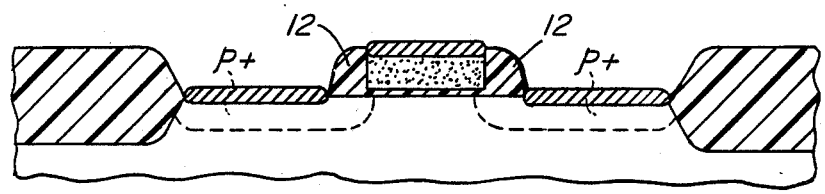

An embodiment of the invention will now be described by way of example with reference to the accompanying drawings in which:

FIGS. 1a to 1c marked PRIOR ART, show processing steps in a conventional technique for forming silicide ohmic contacts; and FIGS. 2a to 2f show stages in a fabrication process according to the present invention for producing a PMOS transistor.

Referring in detail to FIG. 1, there is illustrated a partially completed MOSFET structure in which a polysilicon gate 10 and silicon dioxide side wall spacer structures 12 have been patterned. A film 14 of some refractory metal (typically titanium) has then been deposited, usually by sputtering. In a well-known technique, titanium silicide 15 is formed by a thermal reaction between the titanium and underlying silicon in source, drain and gate regions respectively 16, 18 and 20, FIG. 1b, (T. P. Chow and A. J. Steckel, IEEE Trans. Electron Dev. ED-30, 1480–1497, 1983). Then as seen in FIG. 1c, unreacted titanium which sits on side wall oxide regions 12 is removed by a selective etch, resulting in a self-aligned silicidation process. This reaction proceeds only with difficulty if there is any contamination at metal/silicon interface 22. The reaction may be completely undesirable because of unwanted diffusion occuring at the high temperatures needed (for example, about 800° C. for titanium and greater than 1,000° C. for molybdenum). One solution to these problems is to implant the surface of the structure illustrated in FIG. 1a with heavy ions (typically arsenic, $As^+$) in order to mix the atoms at the metal-silicon interface 22. If this process is carried out at room temperature, then the contaminating layer is dispersed and the subsequent thermal reaction can proceed smoothly. If the implantation is carried out at elevated temperatures (typically greater than 300° C.) then the titanium and silicon may be mixed completely to form a titanium silicide film without a high temperature step. However some annealing is still required to remove ion implantation damage in the silicon.

For PMOS transistors, boron is far too light a p-type dopant to produce significant ion beam mixing. Even the use of a heavier molecule such as $BF_2$ is not worthwhile since the molecule breaks up on impact in the metal films.

By the invention, an electrically inert ionic species, germanium is used, the germanium ion being relatively heavy and therefore very efficient for mixing. The germanium ion may be used alone to effect mixing at the silicon/refractory metal interface together with a measure of amorphization of the silicon. However it is also useful to use a lighter ionic species such as silicon in combination with the germanium in some process sequences. In particular the processes of ion beam mixing and silicon substrate amorphization which is necessary for the formation of shallow junctions, may be combined by using the same ions for both purposes. The value of the silicon implantation is its much greater penetration depth into a substrate at reasonable implantation energies.

A specific example of the invention is now described with reference to FIG. 2. The device fabricated in the process sequence shown in FIG. 2 is a PMOS transistor. Initally a field oxide layer 26 is thermally grown in a patterned structure using a well-known LOCOS process. Then a gate oxide layer 28 is grown, typically to a thickness of 25 nanometers using a standard process, and a polysilicon film is deposited at 625° C. using a standard low pressure chemical vapour deposition (LPCVD) process. The polysilicon film is doped with phosphorus by diffusion from a $POCl_3$ source to increase conductivity. The polysilicon layer is patterned to produce a gate 30 (FIG. 2a) and the polysilicon gate 30 and source and drain regions, respectively 32 and 34, are oxidized in dry oxygen to a total thickness of 100 nanometers.

Figure 2A:
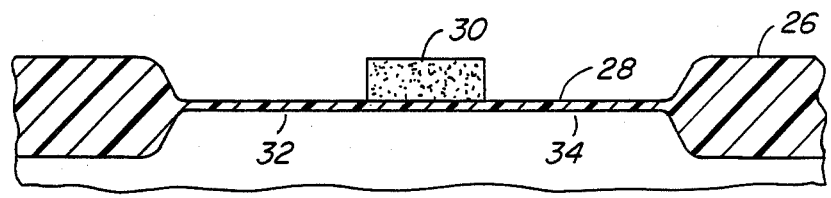
Figure 2B:
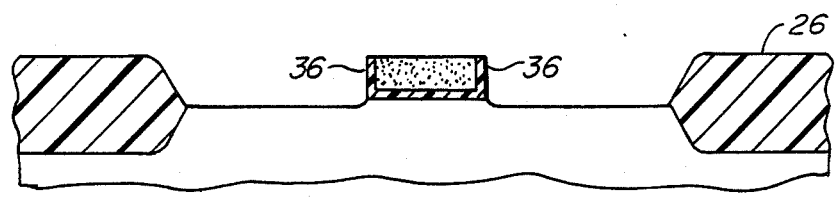
Figure 2C:
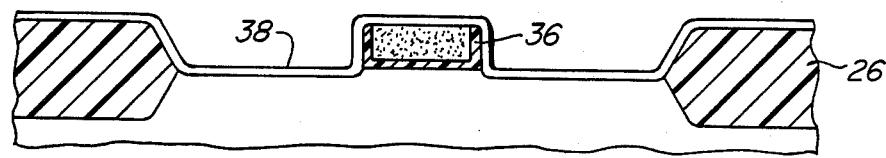
Figure 2D:
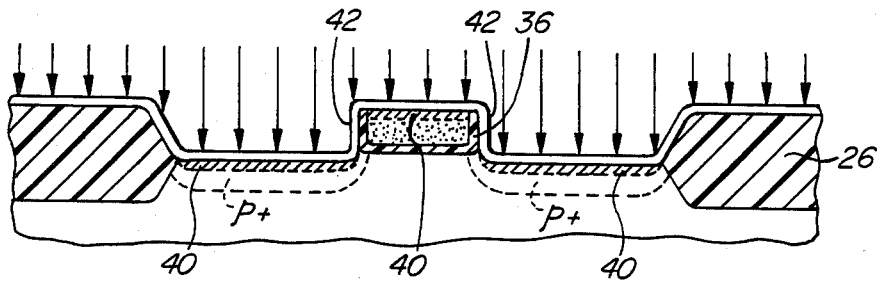

The wafer is then anisotropically reactively ion etched to remove the oxide over the gate, source and drain areas while oxide 36 on the gate walls remains because of its greater thickness in the vertical direction (FIG. 2b). Next titanium metal 38 is deposited by sputtering to a thickness of about 40 nanometers (FIG. 2c).

Subsequently, three separate ion implantation steps are performed in succession: (ii) $5 \times 10^{15}$ $^{28}Si^{30}$/cm$^2$ at an energy of 120 keV; (iii) $3 \times 10^{15}$ $^{11}B^+$/cm$^2$ at 25 keV; and finally (i) $2 \times 10^{15}$ $^{73}Ge^+$/cm$^2$ at 90 keV. The primary function of the silicon implant is to amorphize silicon at the source and drain regions. The amorphous silicon is resistant to dopant diffusion and therefore channelling of the subsequently implanted boron ions beyond the shallow junction depth desired can be prevented. The boron ion implant is performed to render the source and drain regions p-type. The germanium implant may be performed at room temperature or at an elevated temperature to promote both mixing and formation of titanium silicide at regions 40. Annealing of the resulting titanium silicide is carried out by rapid thermal annealing for 10 seconds at 600° C. in nitrogen, this anneal serving both to improve silicide quality and to recrystallize the amorphous silicon at the junction regions by solid phase epitaxy. Of course, the replacement of the boron implant step with an arsenic implant step will result in n-type source and drain regions. The thickness of the silicon amorphized region resulting from the above process is approximately 2000 angstrom and the thickness of the P+ (or N+) junction is approximately 1500 angstrom. Of course, the thickness of the amorphized region and the doped junction will vary in correspondence with variations in the implantation steps.

Figure 2E:
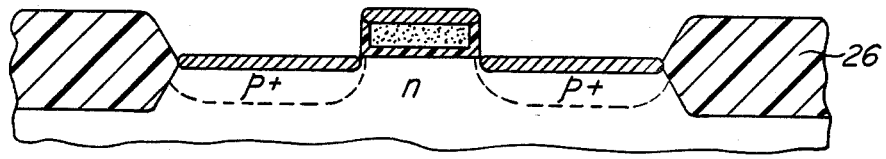

Unreacted titanium 42 on the field oxide and side wall oxide regions is then removed using a solution of ammonium hydroxide (NH$_4$OH) and hydrogen peroxide (H$_2$O$_2$) leaving the structure shown in FIG. 2e.

Figure 2F:
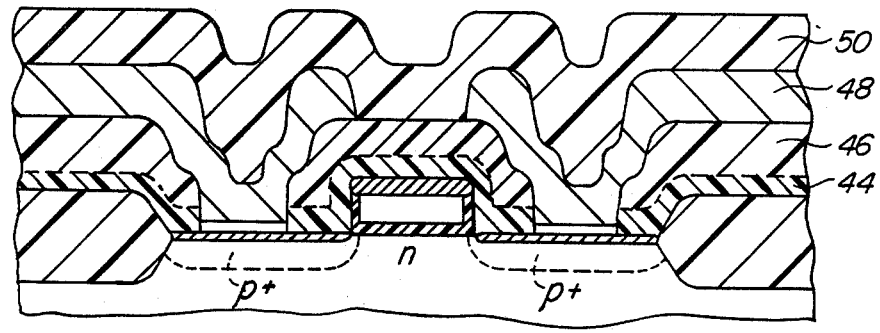

The chip is subsequently processed in a relatively conventional manner. Passivation layers of, for example, a 200 nanometer silicon dioxide (silox) layer 44 followed by an 800 nanometer borophosphosilicate glass (BPSG) layer 46 are then deposited by LPCVD at 350° C. using gas mixtures of SiH$_4$/O$_2$ and SiH$_4$/O$_2$/PH$_3$/B$_2$H$_6$ respectively. The BPSG is then caused to reflow by a rapid thermal heat treatment at 1100° C. for 10 seconds. This thermal step also anneals any remaining implantation damage in the silicon and activates the dopant. The remainder of the process is conventional. Contact windows are opened in the BPSG/silox by a standard photolithographic step, using reactive ion etching, and then an optional barrier metal layer 48, such as Ti, TiN or TiW, and an Al/1% Si film are deposited onto the substrate, patterned photolighographically, and sintered at 450° C. in H$_2$. Finally a 4% P phosphosilicate glass (pyrox) film 50 is deposited and patterned to provide scratch protection. The completed device structure is illustrated in FIG. 2f.

Although the above describes the fabrication of a PMOS device, an NMOS transistor can be fabricated in a similar manner by replacement of the B+ implantation by an As+ implant in which case the silicon pre-amorphization step is optional. The arsenic implantation is carried out at or near room temperature to avoid damage enhanced diffusion problems.

It will be realized that there are several possible variations of the basic process described herein, the key process steps being side wall oxide growth or spacer formation, metal deposition, ion-beam mixing, amorphization (optional), implantation doping, metal/silicon reaction (optional), selective etching of unreacted metal, and thermal activation of the dopant. Thus the process sequence could vary, conditional on (1) the side wall oxide spacer formation preceding metal deposition; (2) the metal deposition preceding ion beam mixing, which in turn precedes the metal/silicon reaction; (3) amorphization preceding doping, and these two processes not being separated by the metal/silicon reaction; (4) selective metal etching following the metal/silicon reaction; and (5) dopant activation following the doping process.

What is claimed is:

1. A process for the fabrication of an MOS semiconductor device comprising:
   forming on a silicon substrate regions of field oxide;
   forming at a region not occupied by field oxide a gate oxide layer;
   forming a device gate over a region of said gate oxide layer;
   designating source and drain areas and removing gate oxide at said source and drain areas;
   depositing a refractory metal on the silicon substrate at said source and drain regions;
   implanting germanium ions at the source and drain areas to mix silicon and the refractory metal at an interface therebetween;
   implanting silicon ions at the source and drain areas to cause amorphization of the silicon to a predetermined depth; and
   implanting dopant ions of a predetermined conductivity type at the source and drain areas whereby to render said areas of said type.

2. A process as defined in claim 1 wherein the dopant is boron whereby the source and drain areas are rendered p-type.

3. A process as defined in claim 1 wherein the dopant is arsenic whereby the source and drain areas are rendered n-type.

* * * * *